(12) United States Patent
Osypiuk et al.

(10) Patent No.: US 10,224,945 B2
(45) Date of Patent: Mar. 5, 2019

(54) METHOD FOR REAL TIME PROCESSING OF FAST ANALOGUE SIGNALS AND A SYSTEM FOR APPLICATION THEREOF

(71) Applicant: Aerobits Sp. z o.o., Szczecin (PL)

(72) Inventors: Rafal Osypiuk, Szczecin (PL); Mateusz Spychala, Szczecin (PL)

(73) Assignee: Aerobits Sp. z o.o., Szczecin (PL)

( * ) Notice: Subject to any disclaimer, the term of this patent is extended or adjusted under 35 U.S.C. 154(b) by 0 days.

(21) Appl. No.: 15/953,325

(22) Filed: Apr. 13, 2018

(65) Prior Publication Data

US 2018/0309457 A1 Oct. 25, 2018

(30) Foreign Application Priority Data

Apr. 21, 2017 (PL) .......................................... 421359

(51) Int. Cl.
*H03M 1/06* (2006.01)
*H03M 1/12* (2006.01)
(Continued)

(52) U.S. Cl.
CPC ....... *H03M 1/0648* (2013.01); *H03M 1/1255* (2013.01); *H03M 1/36* (2013.01);
(Continued)

(58) Field of Classification Search
CPC .... H03M 1/0648; H03M 1/1255; H03M 1/36; G06F 13/4221; G06F 13/4027; G06F 9/44505; G05B 19/0423
(Continued)

(56) References Cited

U.S. PATENT DOCUMENTS 8,860,593 B2 * 10/2014 Kimura ................. H03M 1/182
341/120
9,940,285 B2 * 4/2018 Alley .................. G06F 13/4221

FOREIGN PATENT DOCUMENTS

CN 101871908 B 3/2013
CN 105373041 A 3/2016
CN 105119618 B 11/2017

OTHER PUBLICATIONS

NPX.COM, "NXP LPC4300 microcontroller", Oct. 31, 2013, https://www.nxp.com/docs/en/brochure/75017486.pdf, 2 pages.
(Continued)

*Primary Examiner* — Khai M Nguyen
(74) *Attorney, Agent, or Firm* — Masuvalley & Partners

(57) ABSTRACT

The invention relates to a method for processing high speed analog signals in real time, characterized in that it comprises the following steps:
  a) high speed analog signals are provided to the microprocessor (1),
  b) using a high speed ADC converter (2) integrated in said microprocessor (1), these signals are quantized and converted to digital form without further processing,
  c) the digital data thus acquired is sent via an interface (3), in particular a high speed interface, and an input data busbar (4), to a high speed signal processing unit (5),
  d) said digital data is processed in the high speed signal processing unit (5) in line with the processing feature (6) implemented in said unit (5),
  e) the processing result is sent via an interface (7), in particular a high speed interface, and an output data busbar (8), to the microprocessor (1),
  f) the microprocessor (1) is used to perform operations on the processed data received in line with the program (9) implemented in this microprocessor (1).
(Continued)

The invention also relates to a system for application of this method.

20 Claims, 1 Drawing Sheet

(51) Int. Cl.
  *H03M 1/36* (2006.01)
  *G06F 13/40* (2006.01)
  *G06F 13/42* (2006.01)
  *G05B 19/042* (2006.01)
(52) U.S. Cl.
  CPC ...... *G05B 19/0423* (2013.01); *G06F 13/4027* (2013.01); *G06F 13/4221* (2013.01)
(58) Field of Classification Search
  USPC .................. 341/110, 118, 141, 144, 155
  See application file for complete search history.

(56) References Cited

OTHER PUBLICATIONS

EPO, Extended European Search Report dated Sep. 18, 2018 in European Patent Application No. 18167273.4, 13 pages.

\* cited by examiner

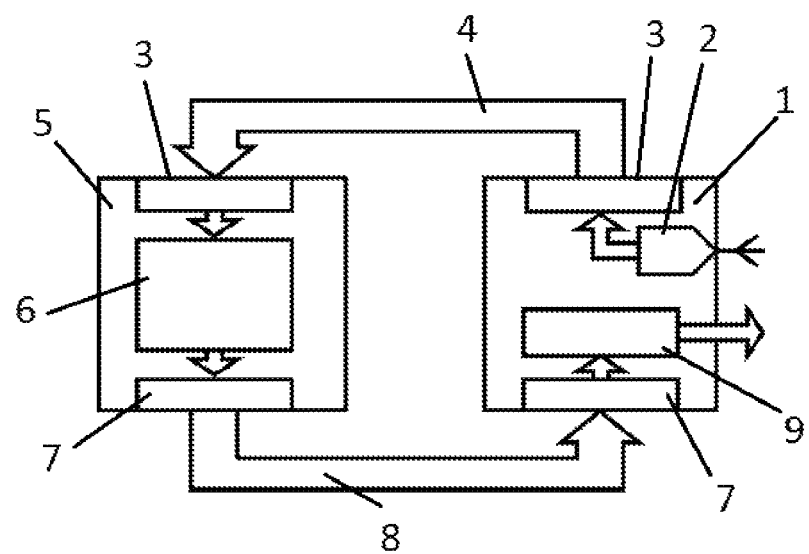

METHOD FOR REAL TIME PROCESSING OF FAST ANALOGUE SIGNALS AND A SYSTEM FOR APPLICATION THEREOF

The invention relates to a method for processing high speed analogue signals in real time to minimize the level of interference, which also allows for the miniaturization of the system architecture, involving the use of a high speed ADC converter integrated in a microcontroller, connected in a loop with a high speed digital data processing unit (e.g. FPGA, DSP). The invention also relates to a system utilizing this method. As used in the present application, the term 'high speed signals' refers to signals that cannot be processed by an online processor (in real time). ADS-B (Automatic Dependent Surveillance-Broadcast) system signal with a 1 Mb/s information transfer rate may be given as an example, which, however, requires oversampling for correct decoding.

BACKGROUND ART

Document CN101871908B discloses a commonly used system consisting of a front-end element, i.e. one that aggregates an analogue (e.g. voltage) signal, containing information, connected to an external ADC discretization system that processes analogue information into digital one. The ADC system then sends the digital signal via a data bus to a FPGA type computation unit, which processes the data and sends it to the main computation unit MCU. The document also discloses a reverse process, wherein data is sent from the MCU to a high-speed FPGA computation unit, which processes and sends it to a DAC system, which processes it into an analogue (e.g. voltage) signal and sends it to the front-end. The described solution has a separate DAC and ADC system. This solution is prone to interference that occurs downstream and upstream the ADC or DAC systems, so that it is extremely difficult to detect and filter out. Another disadvantage is the necessity to transfer data between the separate DAC and ADC, FPGA and MCU processing systems using external buses. The available peripheral DAC and ADC systems are characterized by low data processing capabilities, so that a microcontroller of this type is not applicable in the processing and analysis of high speed signals.

Document CN105119618B describes an improved solution relative to a prior document consisting in the integration of a computation unit and ADC and DAC systems within one computation unit MCU. The disclosed solution solves the problem of interference occurring during the operation of peripheral ADC and DAC systems at the cost of a significant reduction of the processor's computing power and a decelerated operation of the entire system. The computing power is divided among individual elements, which means that if large amounts of data are involved, ADC and DAC systems process large amounts of data and the computation unit is unable to timely process and send it.

There are solutions available on the market offering computation units equipped with efficient and high speed DAC (Digital to Analogue Conversion) and ADC systems for work in the "offline" system, e.g. LPC4370 processor from the company NXP or STM32L496XX from the company STMicroelectronics. The processor works in a system with high speed memory in cycles: first, the processor receives a high speed analogue, e.g. voltage, signal. The signal gets directly to the high-speed (e.g. 80 million samples per second) ADC converter which generates a large amount of data in a very short time. The computation unit does not have sufficient capacity to process it in real time (online mode). Therefore, data in digital form is directed to the high speed memory via a parallel bus. Once the memory is full, data reception stops (offline mode), and the processor retrieves data from memory and processes it at a lower speed than the one at which the data was generated by the ADC system. This solution is not applicable in the analysis of continuous processes, as the time required for the data to be processed exceeds many times the duration of the signal received. Therefore, a system of this kind can only work in processes that require periodic control of a section of the signal.

THE ESSENCE OF THE INVENTION

Accordingly, the object of the present invention is to minimize the level of interference while providing miniaturization of the system architecture when processing high-speed signals by using a high-speed ADC converter integrated in the microcontroller with a digital data high speed processing unit.

The method for processing high speed analogue signals in real time according to the invention is characterized in that it comprises the following steps:
 a) high speed analogue signals are provided to the microprocessor,
 b) using a high speed ADC converter integrated in said microprocessor, these signals are quantized and converted to digital form without further processing,
 c) the digital data thus acquired is sent via an interface, in particular a high speed interface, and an input data busbar, to a high speed signal processing unit,
 d) said digital data is processed in the high speed signal processing unit according to the processing feature implemented in said unit,
 e) the processing result is sent via an interface, in particular a high speed interface, and an output data busbar, to the microprocessor,
 f) the microprocessor is used to perform operations on the processed data received in line with the program implemented in this microprocessor.

Preferably, in step b), the ADC converter converts said signals in real time independently of the operation of the microprocessor central unit, in parallel with the operation of the microprocessor central unit, preferably maximizing the frequency of sampling performance.

Preferably, step d) involves pre-processing of the signal in line with the processing feature implemented.

Preferably, in step f), operations are performed on said data in line with the program implemented in the microprocessor independently of the operation of the ADC converter and in parallel with the operation of said ADC converter.

Preferably, step c) uses a serial or parallel communication interface, in particular a USB OTG, SDIO, EMC or QSPI interface.

Preferably, step c) uses an SRAM type input data bus, in particular one supported by EMC or QSPI.

Preferably, the high speed signal processing unit used is an FPGA type unit, DSP, a high speed microprocessor or a high speed ASCI system.

Preferably, step e) uses a serial or parallel communication interface, in particular a UART, CAN, I2C or SPI interface.

Preferably, in step d) the FPGA performs more complex functions, e.g. frame detection and decoding, noise filtering, input sensitivity control, signal strength determination, preparation of the data to be sent outside of the FPGA etc.

Preferably, the microprocessor used is a microchip equipped with high speed DAC and ADC transducers, in particular a LPC4370 microcontroller from the company NXP or STM32L496XX from the company STMicroelectronics.

The invention also comprises a system for processing high speed analogue signals in real time, characterized in that it comprises the following components:
a) a microprocessor, equipped with means for providing high speed analogue signals,
b) a high speed converter integrated in this microprocessor, configured and programmed to quantize and process said signals into a digital form without further processing,
c) a high speed signal processing unit connected via an input data busbar and an interface, in particular a high speed interface, to said ADC converter,
d) wherein said high speed signal processing unit has an integrated digital data processing feature,
e) and it is connected via the output data busbar and the interface, in particular a high speed interface, to the microprocessor,
f) wherein the microprocessor is configured and programmed to perform operations on the data received via the output data busbar and interface in line with the program integrated in said microprocessor, preferably independently of the operation of the ADC converter and in parallel with the operation of said ADC converter.

Preferably, the interface is a serial or parallel interface, especially a USB OTG, SDIO, EMC or QSPI interface, and the interface is a serial or parallel communication interface, especially a UART, CAN, 120 or SPI interface.

Preferably, the input data busbar is an SRAM type busbar, especially one supported by EMC or QSPI.

Preferably, the high speed signal processing unit is an FPGA type unit, DSP, a high speed microprocessor or a high speed ASCI system.

Preferably, the microprocessor is a microchip equipped with high speed DAC and ADC transducers, in particular a LPC4370 microcontroller from the company NXP or STM32L496XX from the company STMicroelectronics.

The method and the system described improve the process of processing high speed analogue signals and simplifies the system. In particular:

By using the integrated high speed ADC converter in the microprocessor, it is not necessary to use the autonomous ADC system, which reduces the number of components required for the construction of the system, reduces the level of interference and simplifies the architecture of the system.

Using an external high speed signal processing unit connected into a loop by a data bus with a microprocessor so as to make the signals from the ADC reach directly the external high speed signal processing unit, where they are converted without putting a load on the computing power of the processor, and then the processed signals return to the processor, makes it possible to process high speed analogue signals with maximum sampling without the need to place them into memory, i.e. in real time.

More specifically, the method of processing fast analogue signals in real time to minimize the level of interference, which also allows for the miniaturization of the system architecture, involving the use of a fast ADC converter incorporated in a microcontroller, connected in a loop with a fast digital data processing unit according to the invention, consists in high speed analogue signals being sent to the processor. Then, using the integrated high-speed ADC converter (analogue-to-analogue converter), [data] is quantized and converted to digital form without further processing. The digital data is then sent via an interface, in particular a high speed interface, and an input data busbar, to an external high speed signal processing unit. The data is then converted in line with the processing feature implemented in this unit, and the processing result is sent using the interface, in particular a high speed interface, via the output data busbar to the microprocessor. In the next step, the processed data received by the microprocessor is used to implement the functions (operations) implemented therein on said data.

PREFERRED EMBODIMENT OF THE INVENTION

The invention will be presented in greater detail in a preferred embodiment, with reference to the accompanying drawing, in which:

FIG. 1 Is a schematic illustration of the method of processing high speed analogue signals in real time according to the invention, implemented in a suitable electronic system, that is using a microprocessor 1, a high speed ADC converter 2, an input data interface 3, an input data busbar 4, a high speed signal processing unit 5, a processing feature 6, an output data interface 7, an output data busbar 8, a processor program 9.

EXAMPLE 1

In the preferred embodiment of the invention, the method for processing high speed analogue signals in real time to minimize the level of interference, which also allows for the miniaturization of the system architecture, is based on the use of a high speed ADC converter integrated in a microcontroller, connected in a loop with a high speed digital data processing unit. First, high speed analogue signals are sent to the microprocessor 1. Then, using the integrated high-speed ADC converter 2 it is quantized and converted to digital form without further processing. The digital data is then sent using the interface 3, in particular a high speed interface, e.g. USB OTG (Universal Serial Bus On-The-Go) a), SDIO Secure Digital Input Output), using an input data busbar 4, especially SRAM (Static Random Access Memory), supported e.g. by EMC External Memory Controller) by the company NXP or QSPI Quad Serial Peripheral Interface) by the company STMicroelectronics for a high speed signal processing unit 5, especially the FPGA (Field-Programmable Gate Array) type. Alternatively, the high speed signal processing unit may be of the DSP (Digital Signal Processor) type, it can be a high speed microprocessor, it can be a high speed ASCI Application-Specific Integrated Circuit) system. The digital data is then converted in line with the processing feature 6 implemented in this unit 5, and the processing result is sent using the interface 7, in particular a high speed interface, e.g. UART (Universal Asynchronous Receiver-Transmitter, CAN (Controller Area Network), 120 (Inter-Integrated Circuit) or SPI Serial Peripheral Interface), using the output data busbar 8 to the microprocessor 1. In the next step, the processed data received by the microprocessor 1 is used in the performance of the program 9 implemented in said microprocessor 1, i.e. the microprocessor 1 performs operations on said data in line with the program 9.

The invention claimed is:
1. A method for processing high-speed analogue signals in real time, the method comprising the steps of:

providing high-speed analogue signals to a microprocessor;

quantizing and converting the provided high-speed analogue signals into digital data without further processing using a high-speed ADC converter integrated within said microprocessor;

transmitting the acquired digital data to a high-speed signal processing unit via an input high-speed interface and an input data bus bar;

processing the transmitted digital data using the high-speed signal processing unit according to processing features implemented in said high-speed signal processing unit;

transmitting the processed data to the microprocessor using an output high-speed interface and an output data bus bar;

performing operations on the received processed data using the microprocessor according to programs implemented in said microprocessor.

2. The method as recited in claim 1, wherein in the quantizing and converting step, the high-speed ADC converter is configured for operating in real-time system, independently from and in parallel with said microprocessor, to maximize sampling frequency.

3. The method as recited in claim 1, wherein the processing step comprises a pre-processing of the transmitted digital data according to processing features implemented in the high-speed signal processing unit.

4. The method as recited in claim 1, wherein the operations executed in the performing operations step are performed independently from and in parallel with the operations performed by the high-speed ADC converter.

5. The method as recited in claim 1, wherein the input high-speed interface comprises a serial or a parallel communication interface selected from the group consisting of USB OTG interface, SDIO interface, EMC interface and QSPI interface.

6. The method as recited in claim 1, wherein the input data bus bar comprises an SRAM type input data bus bar supported by EMC or QSPI.

7. The method as recited in claim 1, wherein the high-speed signal processing unit comprises an FPGA, a DSP, a high-speed microprocessor or a high-speed ASCI system.

8. The method as recited in claim 1, wherein the output high-speed interface comprises a serial or a parallel communication interface and the output data bus bar comprises a serial or a parallel data bus bar, and wherein both the output high-speed interface and the output data bus bar are selected from the group consisting of UART interface, CAN interface, I2C interface and SPI interface.

9. The method as recited in claim 1, wherein the processing step comprises a step of carrying out a conversion of a linear code of the digital data into a numeral system.

10. The method as recited in claim 9, wherein the numeral system comprises a quad, an octal or a hexadecimal numeral system.

11. The method as recited in claim 1, wherein the microprocessor comprises a microchip equipped with high-speed DAC and ADC transducers.

12. A system for processing high-speed analogue signals in real time, the system comprising:
   a microprocessor adapted to receive high-speed analogue signals;
   a high-speed ADC converter, integrated within said microprocessor, is configured to process and quantize the received high-speed analogue signals into digital data without further processing;
   a high-speed signal processing unit connected to the high-speed ADC converter via an input data bus bar and an input high-speed interface and is connected back in a loop to the microprocessor via an output data bus bar and an output high-speed interface, said high-speed signal processing unit is configured to perform a conversion operation on said digital data according to processing features implemented in said high-speed signal processing unit,
   wherein the microprocessor is configured to perform operations on data received from the output data bus bar and the output high-speed interface according to programs implemented in said microprocessor.

13. The system as recited in claim 12, wherein operations performed by the microprocessor are executed independently from and in parallel with the operations performed by the high-speed ADC converter.

14. The system as recited in claim 12, wherein the input high-speed interface comprises a serial or a parallel communication interface selected from the group consisting of USB OTG interface, SDIO interface, EMC interface and QSPI interface.

15. The system as recited in claim 12, wherein the output high-speed interface comprises a serial or a parallel communication interface and the output data bus bar comprises a serial or a parallel data bus bar, and wherein both the output high-speed interface and the output data bus bar are selected from the group consisting of UART interface, CAN interface, I2C interface and SPI interface.

16. The system as recited in claim 12, wherein the input data bus bar comprises an SRAM type input data bus bar supported by EMC or QSPI.

17. The system as recited in claim 12, wherein the high-speed signal processing unit comprises an FPGA, a DSP, a high-speed microprocessor or a high-speed ASCI system.

18. The system as recited in claim 12, wherein the microprocessor comprises a microchip equipped with high-speed DAC and ADC transducers.

19. The system as recited in claim 12, wherein the conversion operation comprises carrying out a conversion of a linear code of the digital data into a numeral system.

20. The system as recited in claim 19, wherein the numeral system comprises a quad, an octal or a hexadecimal numeral system.

* * * * *